(12) United States Patent
Lee et al.

(10) Patent No.: US 9,095,920 B2
(45) Date of Patent: Aug. 4, 2015

(54) PREHEAT MODULE, PREHEAT ZONE AND PREHEAT SECTION USING THE SAME

(71) Applicant: DELTA ELECTRONICS POWER (DONG GUAN) CO., LTD., Guangdong Province (CN)

(72) Inventors: Wen-fu Lee, Dongguan (CN); Yu-shan Lee, Dongguan (CN)

(73) Assignee: DELTA ELECTRONICS POWER (DONG GUAN) CO., LTD. (CN)

( * ) Notice: Subject to any disclaimer, the term of this patent is extended or adjusted under 35 U.S.C. 154(b) by 219 days.

(21) Appl. No.: 13/897,921

(22) Filed: May 20, 2013

(65) Prior Publication Data
US 2014/0109431 A1   Apr. 24, 2014

(30) Foreign Application Priority Data
Oct. 19, 2012   (CN) .......................... 2012 1 0399577

(51) Int. Cl.
| | |
|---|---|
| *F26B 19/00* | (2006.01) |
| *B23K 3/04* | (2006.01) |
| *B23K 1/008* | (2006.01) |
| *B23K 3/08* | (2006.01) |
| *H05K 3/34* | (2006.01) |
| *B23K 3/06* | (2006.01) |

(52) U.S. Cl.
CPC . *B23K 3/04* (2013.01); *B23K 1/008* (2013.01); *B23K 3/0653* (2013.01); *B23K 3/08* (2013.01); *H05K 3/3494* (2013.01); *H05K 2203/111* (2013.01)

(58) Field of Classification Search
CPC ................ F26B 3/00; F26B 5/00; F26B 9/00; F26B 19/00; F26B 19/08; B23K 1/00; B23K 1/008; B23K 1/012; B23K 3/00; B23K 3/04
USPC ........... 34/201, 202, 210, 217, 218, 232, 240; 432/152, 207, 209
See application file for complete search history.

(56) References Cited

U.S. PATENT DOCUMENTS

| | | | | |
|---|---|---|---|---|
| 2,291,145 | A | * | 7/1942 | Buck .............................. 236/9 A |
| 4,020,822 | A | * | 5/1977 | Harris ........................ 126/110 R |
| 4,427,374 | A | * | 1/1984 | Miller .............................. 432/48 |
| 4,751,910 | A | * | 6/1988 | Allen et al. ................... 126/117 |
| 4,978,291 | A | * | 12/1990 | Nakai ............................. 431/12 |
| 4,993,402 | A | * | 2/1991 | Ripka .......................... 122/18.2 |
| 5,282,457 | A | * | 2/1994 | Kraemer et al. .......... 126/110 C |

(Continued)

FOREIGN PATENT DOCUMENTS

| | | |
|---|---|---|
| CN | 101309771 | 11/2008 |
| CN | 20204543 | 11/2011 |

(Continued)

*Primary Examiner* — Stephen M Gravini
(74) *Attorney, Agent, or Firm* — Lowe Hauptman & Ham, LLP

(57) ABSTRACT

The present invention provides a preheat module, which comprises a heating chamber, a blower and a platform; the heating chamber comprises a heating device and a first inlet; the blower comprises a second inlet and a first outlet, and the second inlet is connected to the heating chamber; the platform comprises a third inlet and a second outlet, and the third inlet is connected to the first outlet; the first inlet and the second outlet are set in a same plane. An advantage of the present invention is that it can reduce the energy consumption also can satisfy the requirement of conserving electrical power and protecting the environment.

12 Claims, 7 Drawing Sheets

(56) References Cited

U.S. PATENT DOCUMENTS

| | | | |
|---|---|---|---|
| 5,320,523 A * | 6/1994 | Stark | 431/353 |
| 2003/0136134 A1 * | 7/2003 | Pun | 62/91 |
| 2009/0020456 A1 * | 1/2009 | Tsangaris et al. | 208/133 |
| 2009/0038315 A1 * | 2/2009 | Johnson | 60/783 |
| 2010/0219228 A1 | 9/2010 | Yamashita et al. | |
| 2014/0049916 A1 * | 2/2014 | Chen | 361/695 |
| 2014/0109431 A1 * | 4/2014 | Lee et al. | 34/217 |
| 2014/0112771 A1 * | 4/2014 | Li et al. | 415/214.1 |

FOREIGN PATENT DOCUMENTS

| | | |
|---|---|---|
| TW | 200605245 | 2/2006 |
| TW | M389343 | 9/2010 |

* cited by examiner

PREHEAT MODULE, PREHEAT ZONE AND PREHEAT SECTION USING THE SAME

TECHNICAL FIELD OF THE INVENTION

The present invention relates to a field of facility and technology for electrical productions, and more particularly to a preheat module, preheat zone and preheat section using the same for an energy efficient furnace.

BACKGROUND OF THE INVENTION

Furnace for wave soldering of tin is one of important facility for an electrical factory. The furnace for wave soldering of tin is a high energy consumption facility, especially for the preheat section. In prior art, the preheat section generally comprised two or three preheat zones, each of which had a width of 60 to 80 cm. An electrical controlled system was introduced to control heating power of a heater according to a set temperature, to ensure that a PCB (Printed Circuit Board) was heated to a best temperature for the wave soldering after passing through the preheat section. The preheat section had an energy consumption of about 30 to 45 kW, generally accounting for 60% to 70% of the total energy consumption of the furnace.

Although the PCBs are in variable sizes, all tubes of the heaters must be opened because of the designed structure of the tubes, and this causes waste of electrical energy for unused parts of the tubes, when preheating the PCBs with relative small sizes.

FIG. 1 illustrates a schematic diagram of the preheat section in the furnace for wave soldering of tin in the prior art. Referring to FIG. 1, the preheat section 10 in the furnace for wave soldering of tin comprised three preheat zones 101, 102, and 103, which are set parallel in a plane. A guider 106 is set above the preheat zones 101, 102, and 103. A PCB 104 is transferred from the preheat zone 101 to the preheat zone 102 and 103 along the guider 106 (directed by an arrow as shown in FIG. 1). Each one of the preheat zones 101, 102, and 103 comprises a plurality of heating tubes 104, which are set parallel, and the axial direction of the heating tubes 105 is perpendicular to the moving direction of the PCB 104.

As illustrated in FIG. 1, the preheat zones 101, 102, and 103 had length of 700 mm, and width of 600 mm. The axial direction of the heating tubes 105 is perpendicular to the moving direction of the PCB 104, in other words, the axial direction of the heating tubes 105 is the breadth direction of the preheat zones 101, 102, and 103. Furthermore, the length of each of the heating tubes 105 is substantially equaled to the width of the preheat zones 101, 102, and 103. If the PCB 104 had a small size, for example 200 mm in the length and 150 mm in the width, when the PCB 104 moved along the direction perpendicular to the axial direction of the heating tubes 105 through the preheat zones 101, 102 and 103 in sequence, only a part with 150 mm in length of each heating tube 105 was useful for the PCB 104. But all the heating tubes 105 must be opened as a whole when preheating the PCB 104. So it caused the waste of electrical energy for the opened part uncovered by the PCB 104 in the axial direction of the heating tubes 105, as the part defined by a dash line frame illustrated in FIG. 1, which were opened but no contribution to the PCB 104.

The size of the preheat zone is 700 mm*600 mm, and each preheat zone contains 6 heating tubes 105 with 600 mm in length and 2 kW in energy consumption, so the power of each preheat zone is 12 kW, and the total power of the three preheat zone is 36 kW. The energy consumption of the preheat zone is not influenced by the size of the PCB 104 for all the heating tubes 105 must be opened. In other words, the total heating power is always 36 kW, whatever the size of the PCB 104 is large or small.

So a new heating structure muse be designed to reduce the waste of power and conserve energy.

SUMMARY OF THE INVENTION

To solve the above-mentioned drawbacks, an object of the present invention is to provide a preheat module, preheat zone and preheat section using the same in order to conserve energy.

In order to solve the above-mentioned problem, the present invention provides a preheat module, comprising a heating chamber comprising a heating device and a first inlet, wherein the heating device is used for heating the air in the heating chamber, and the first inlet is used for guiding the air into the heating chamber; a blower comprising a second inlet and a first outlet, wherein the second inlet is connected to the heating chamber for pumping the hot air, and the first outlet is used for the hot air flowing out of the blower; and a platform comprising a third inlet and a second outlet, wherein the third inlet is connected to the first outlet for guiding the hot air from the blower flowing to the platform, and the second outlet is used for the hot air from the third inlet flowing out of the preheat module to heat the sample; wherein the first inlet and the second outlet are set in a same plane, and the first inlet is used for the hot air from the second outlet entering into the heating chamber.

Optionally, the platform, the heating chamber, and the blower are set in sequence along the direction perpendicular to the plane of second outlet; two first inlets are set in the plane of the second outlet, and the longer sides of the two first inlets are parallel with the longer sides of the second outlet, the second outlet is between the two first inlets; and the second outlet has two sides which are not adjacent to the first inlets, and the third inlet is set in the plane perpendicular to the plane of the second outlet.

Optionally, the second outlet of the platform further comprises a partition having a plurality of holes thereon, and the holes are used for guiding the hot air form the blower.

Optionally, the heating device comprises one or more tubes set along an axial direction of the preheat module.

The present invention further provides a preheat zone, comprising a control module; a plurality of preheat modules mentioned above, wherein the preheat modules are set parallel in the axial direction; and wherein the control module electrically connects to each preheat module and controls the preheat module to be open and closed independently.

Optionally, the second outlet of the platform further comprises a partition having a plurality of holes thereon and the holes are used for guiding the hot air form the blower.

Optionally, the heating device comprises one or more tubes set along an axial direction of the preheat module.

Optionally, the preheat zone further comprises a guider, which is set over a surface of the preheat zone with a distance, and the guider is set parallel to the axial direction of the preheat module, in order to transfer a sample set.

Optionally, the sample set on a frame, which is moved by the guider.

The present invention further provides a preheat section of a furnace, wherein the preheat section comprises one or more preheat zones mentioned above, the preheat zones are in a same plane, and are set parallel along a moving direction of the sample set.

Optionally, the preheat section further comprises a guider, which is set over a surface of the preheat zone with a distance, and the guider is set parallel to the axial direction of the preheat module, in order to transfer the sample set.

Optionally, the furnace is a furnace for wave soldering of tin, and the sample set is a printed circuit board.

The advantage of the present invention is that the preheat module comprises the recycling structure for the hot air, to reduce the energy consumption. The preheat zone comprises a plurality of preheat modules, and can operate the preheat modules opened or closed. The preheat modules without the samples are closed, and the preheat modules with the samples are opened. So that, it can reduce the energy consumptions and can satisfy the requirement of conserving electrical power and protecting the environment.

DETAILED DESCRIPTION OF THE INVENTION

Figure 1:
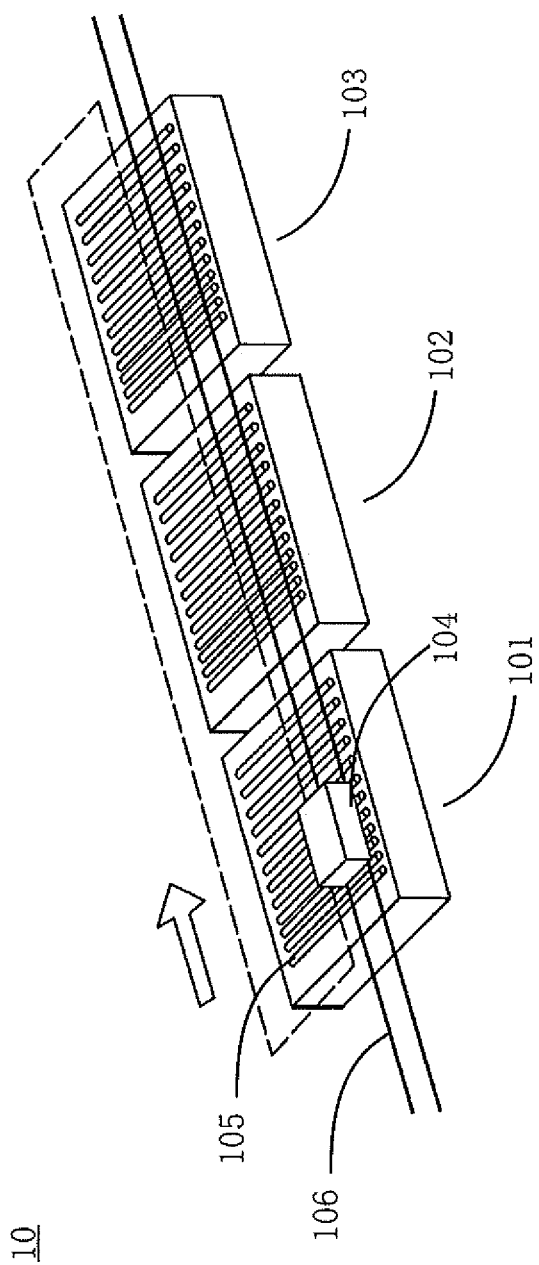
FIG. 1 illustrates a schematic diagram of the preheat section in the furnace for wave soldering of tin in the prior art.

Embodiments of a preheat module, preheat zone and preheat section using the same by the present invention are described in detail with the following accompanying diagrams. It is not real structure of facilities but the relative schematic location of each facility as illustrated in the drawings. In our invention, the preheat module, preheat zone and preheat section using the same can be used in variable facilities. In embodiments as followed, a furnace for wave soldering of tin will be used as an example. A PCB will be used as an example for the sample waiting for heating.

Figure 2:
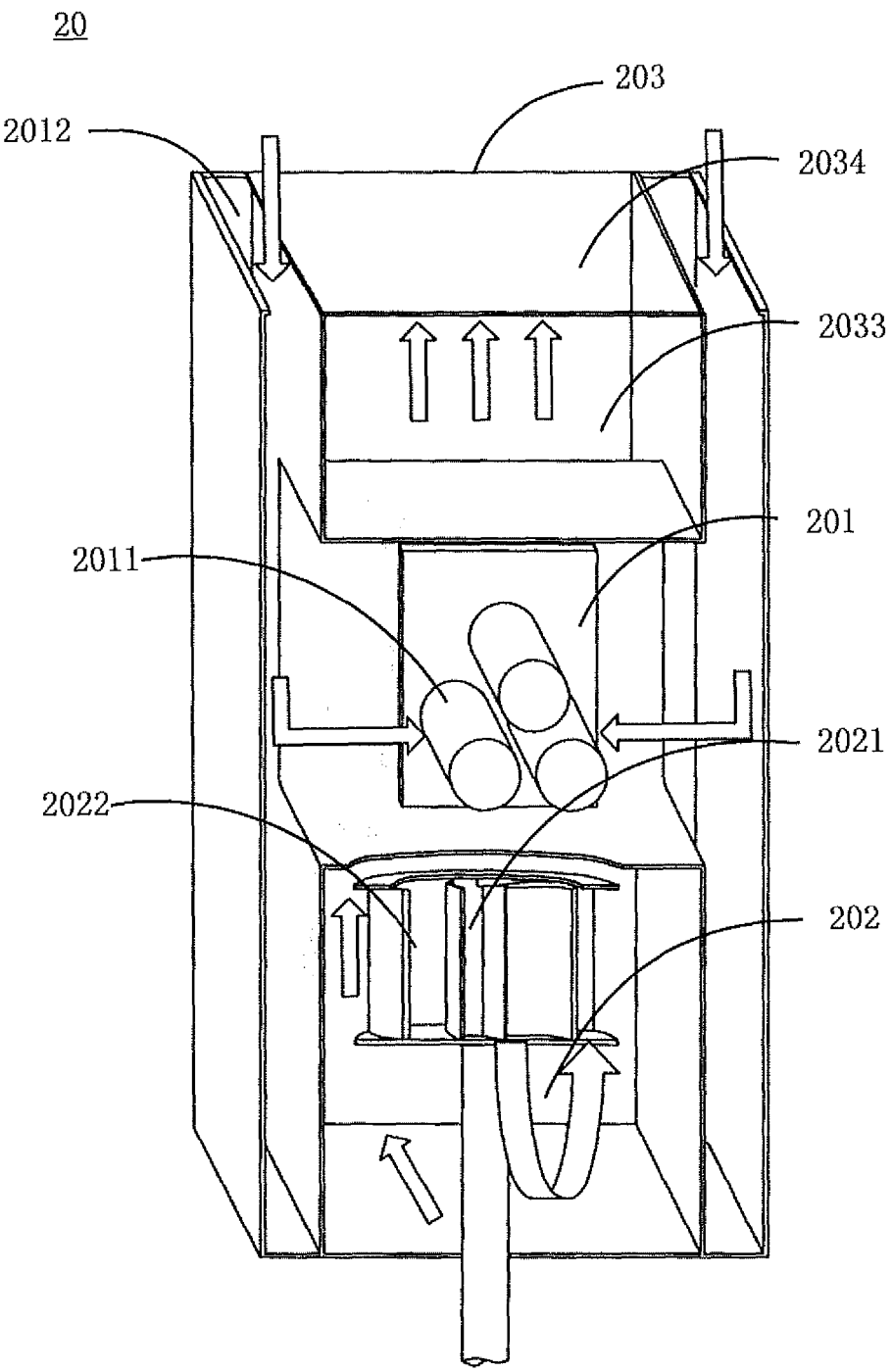
FIG. 2(a) illustrates a cross-section schematic diagram in an embodiment of this invention.
FIG. 2(b) illustrates a cross-section schematic diagram in an embodiment of this invention.
FIG. 2(c) illustrates an exploded schematic diagram of the heating chamber 201.
FIG. 2(d) illustrates a schematic diagram of combining the blower 202 and the heating chamber 201.
FIG. 2(e) illustrates a schematic diagram of the circulating heat air.
Figure 2:
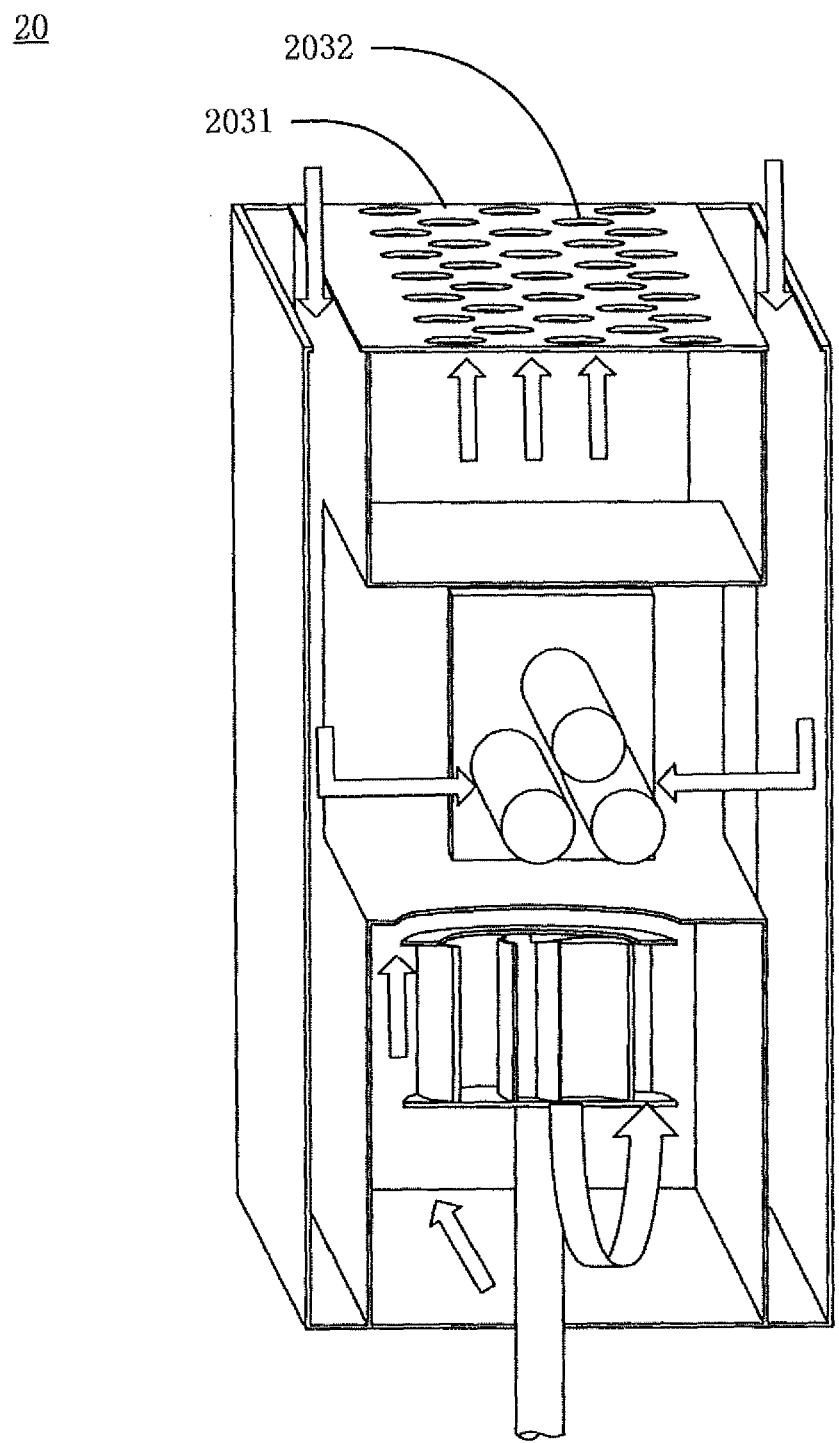

FIG. 2(a) illustrates a cross-section schematic diagram in an embodiment of this invention. Referring to FIG. 2(a), a preheat module 20 comprises a heating chamber 201, a blower 202, and a platform 203. The heating chamber 201 comprises a heating device 2011 and a first inlet 2012. The blower 202 comprises a second inlet 2021 and a first outlet 2022. The platform 203 comprises a third inlet 2033 and a second outlet 2034. The platform 203, heating chamber 201, and blower 202 are set in sequence along the direction perpendicular to the plane of second outlet 2034. In other words, the heating chamber 201 is under the platform 203, and the blower 202 is under the heating chamber 201. The structure of preheat module 20 mentioned above can save the horizontal space of preheat module 20.

Figure 2C:
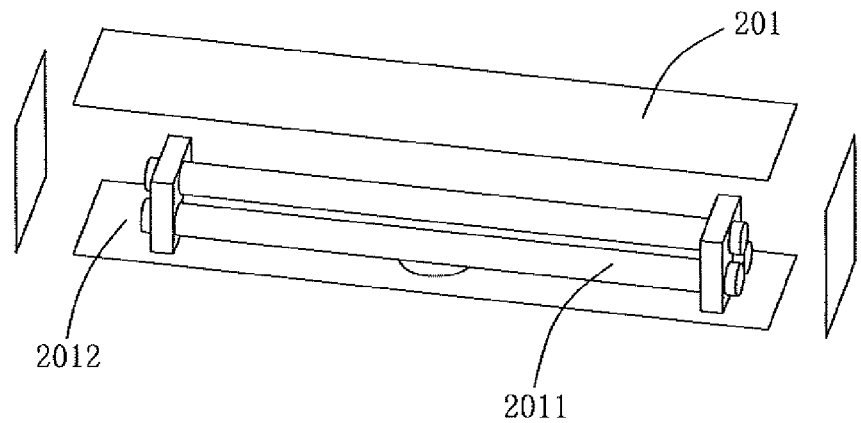

FIG. 2(c) illustrates an exploded schematic diagram of the heating chamber 201. Referring to FIGS. 2(a) and 2(c), the chamber 201 comprises the heating device 2011 which is used for proving heat to preheat module 20. In this embodiment, the heating device 2011 is a set of tubes settled along the direction perpendicular to the axial direction of the preheat 20. In other embodiments of this invention, the heating device 2011 may be other heating devices well known for persons in this technology filed, such as heating blocks, resistance wires, etc.

The heating chamber 201 has a first inlet 2012, which is communicating to the preheat module 20, in order to introduce air out of the preheat module 20 to heating chamber 20. The heating device 2011 is used for heating the air. Two edges of the axial direction and upper and lower surfaces of the heating chamber 201 are sealed in this embodiment. Two sides of the heating chamber 201 have holes which are the first inlets 2012. In other embodiments, the first inlets 2012 may be set at other location in the heating chamber 201. For example, if the two sides of the heating chamber 201 are sealed, and the two edges of the axial direction of the heating chamber 201 have holes, which should be the first inlets 2012. Anyway, the first inlets 2012 are set to ensure the air out of the preheat module 20 can be introduced to the heating chamber 201, in order to prove the fresh air to the heating chamber 201.

Figure 2D:
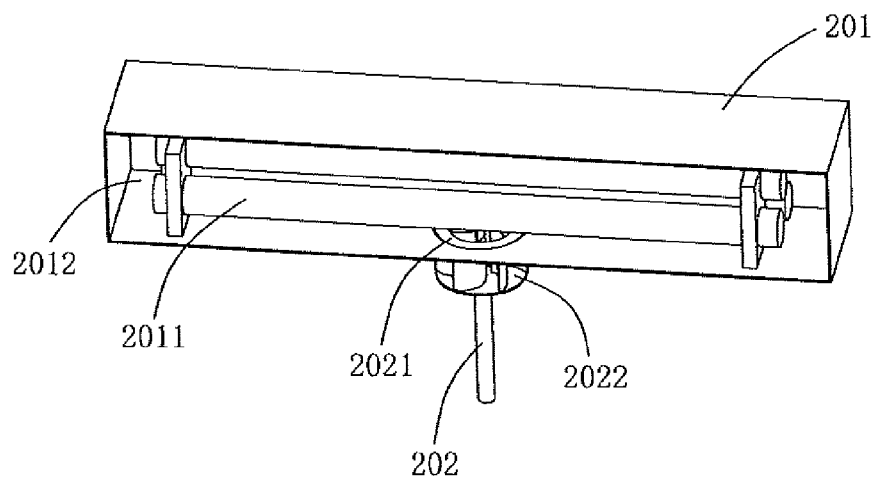
Figure 2:
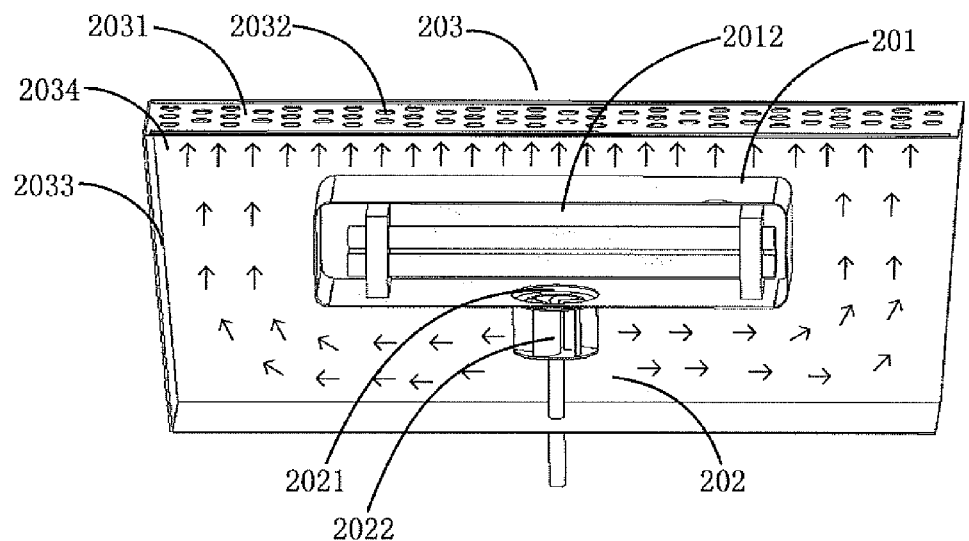

FIG. 2(d) illustrates a schematic diagram of combining the blower 202 and the heating chamber 201. Referring to FIGS. 2(a) and 2(d), the blower 202 has the second inlet 2021 and the first outlet 2022. The second inlet 2021 connects to the heating chamber 201. Once the blower 202 is launched, it can cause a negative pressure in the heating chamber 201, and then hot air in the heating chamber 201 can be extracted to the blower 202 through the first inlets 2012 of the heating chamber 201. Because of the negative pressure in the heating chamber 201, outer air can also enter into the heating chamber 201 through the first inlets 2012. The first outlet 2022 connects to the third inlet 2033 of the platform 203 to guide the hot air, which is extracted from the heating chamber 201 by the blower 202, to the third inlet 2033 of the platform 203. In this embodiment, the blower 202 is a fan, which also may be other blowing machines in the other embodiments.

Referring to FIG. 2(a), the platform 203 comprises the third inlet 2033 and the second outlet 2034. The third inlet 2033 connects to the first outlet 2022, to lead the hot air from the blower 202 to the platform 203. The hot air from the third inlet 2033 is further out of the preheat module 20.

The first inlets 2012 and the second outlet 2034 are set in a same plane, which can partly recover the hot air from the second outlet 2034 through the first inlets? 2012, except the hot air used to heat samples. So the hot air can be reused, in order to conserve energy. Furthermore, two first inlets 2012 are set in the plane of the second outlet 2034, and the longer sides of the two first inlets 2012 are parallel with the longer sides of the second outlet 2034. The second outlet 2034 is between the two first inlets 2012, and has two sides which are not adjacent to the first inlets 2012. The third inlet 2033 is set in the plane perpendicular to the plane of the second outlet 2034. The structure mentioned above can avoid cold air from the first inlets 2012 entering into the platform 203, and to influence the temperature thereof.

Furthermore, referring to FIG. 2(b), the second outlet 2034 of the platform 203 comprises a partition 2031. The partition 2031 has a plurality of holes 2032 thereon and the holes 2032 are used for guiding the hot air form the blower. The hot air can leave the second outlet 2034 through the holes 2032, and then heat the samples. In other embodiments, there are not holes but slits in the partition 2031 of the second outlet 2034.

The slits can also make the hot air passing by. Furthermore, the partition 2031 can also be omitted in the second outlet 2034 of the platform 203, and the samples are heated by the hot air from the blower 202 directly.

FIG. 2(e) illustrates a schematic diagram of the circulating heat air. Referring to the direction of arrows in the FIGS. 2(a) and 2(e), the air, comprising the hot air from the second outlet 2034, enters into the heating chamber 201 through the first inlets 2012 in a same plane to the second outlet 2034. The air entering into the heating chamber 201 is heated by the heating device 2011 in the heating chamber 201. The blower 201 is launched, and pumps the hot air in the heating chamber into the blower 201 through the second outlet 2021. There is a negative pressure in the heating chamber 201 for the pumping of the blower 201, so the air can enter into the heating chamber 201 through the first inlets 2012. The hot air in the blower 201 enters into the platform 203 through the third inlet 2033 of the platform 203 and the first outlet of the blower 202. The hot air in the platform 203 flows out of the preheat module 20 through the second outlet 2034 of the platform 203, and heats the samples. If there is the partition 2031 in the second outlet 2034 of the platform 203, the hot air flow out of the preheat module 20 through the holes 2032 in the partition 2031, in order to obtain a uniform heating process to the samples.

In the preheat module 20 of this embodiment, a part of the hot air from the preheat module 20, except for heating the samples, enters into the heating device 2011 again through the first inlets 2012, and then flow to the platform 203 through the blower 202. For the air entering into the heating device 2011 again have a higher temperature then the cold air from outer the preheat module 20, the heating device 2011 consumes lower energy for heating the recovered air than for heating the cold air. So, the preheat module 20 can realize the recover of the hot air, and then reduce the waste of power and conserve energy.

Figure 3:
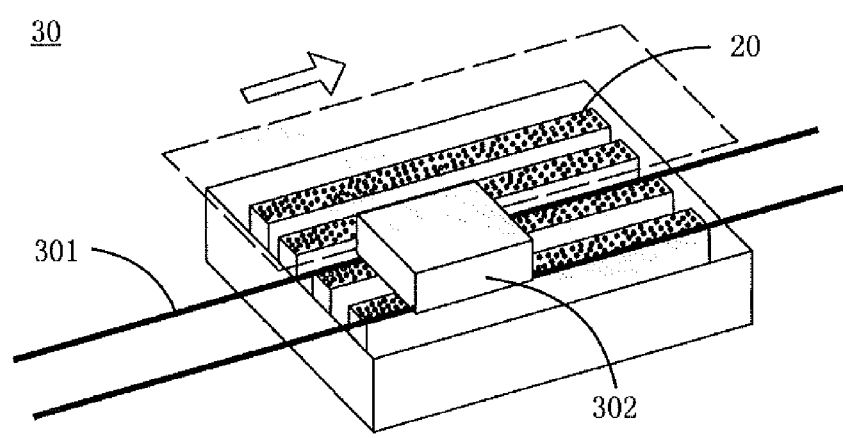
FIG. 3(a) illustrates a schematic diagram of a preheat zone in one embodiment.
FIG. 3(b) illustrates a schematic diagram of the sample set and moved on a frame.
Figure 3:
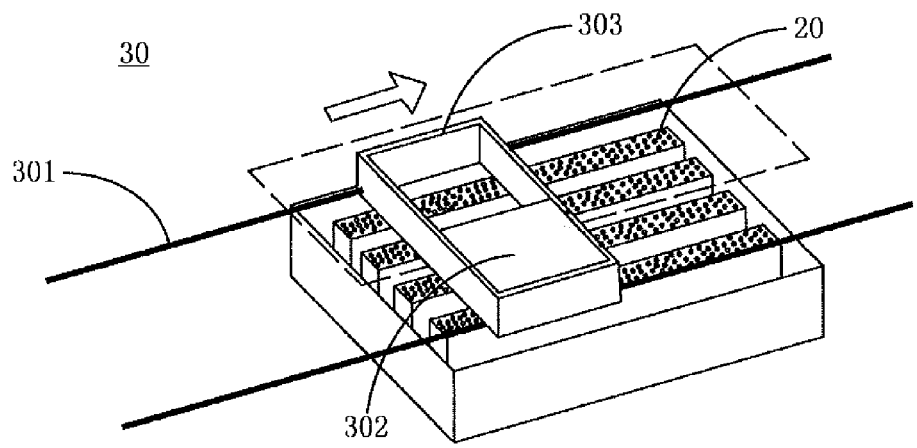

FIG. 3(a) illustrates a schematic diagram of a preheat zone in one embodiment. Referring to FIG. 3(a), the preheat zone 30 comprises a plurality of preheat module 20. For brevity purpose, only four preheat modules 20 are illustrated in FIG. 3(a), which are set parallel to each other in the axial direction, and also parallel to the transforming direction (as the direction of the arrows illustrated in FIG. 3(a) of the sample 302. A guider 301 is set over a surface of the preheat zone 30 with a distance. The guider 301 parallel to the axial direction of the preheat module 20, in order to transfer the sample 302. When the sample 302 passes through the surface of the preheat zone 30, the sample 302 is heated by the preheat module 20. In other embodiments, of course the manual operation or other mechanical operations, instead of the guider 301, can also be used to move the sample 302.

The width of the guider 301 can be adjusted according to the size of the sample 302, for fixing and transforming the sample 302. Furthermore, as illustrated in FIG. 3(b), the width of the guider 301 is fixed, containing the sizes of all the preheat module 20. The sample is fixed on a frame 303 which has the same width to the guider 301, and then the frame 303 is set on the guider 301. The guider 301 can support and transform the frame 303. Advantage of the structure mentioned above is to avoid the operation of adjusting the guider 301 when heating samples with variable sizes. An inaccuracy operation of adjusting the guider 301 may be cause the sample 302 loosing or dropping from the guider 301.

The preheat zone 30 also comprises a control module (not illustrated in the figures), which electrically connects to each one of preheat modules 20, and control the open and close of each preheat module 20 independently. When the samples 20 with a variable size passes through the preheat zone 30, the control module only opens the preheat modules covered by the sample 20, and the other preheat modules are closed (as illustrated in the dash-line frame in FIG. 3(a)) to conserve electrical power.

Figure 4:
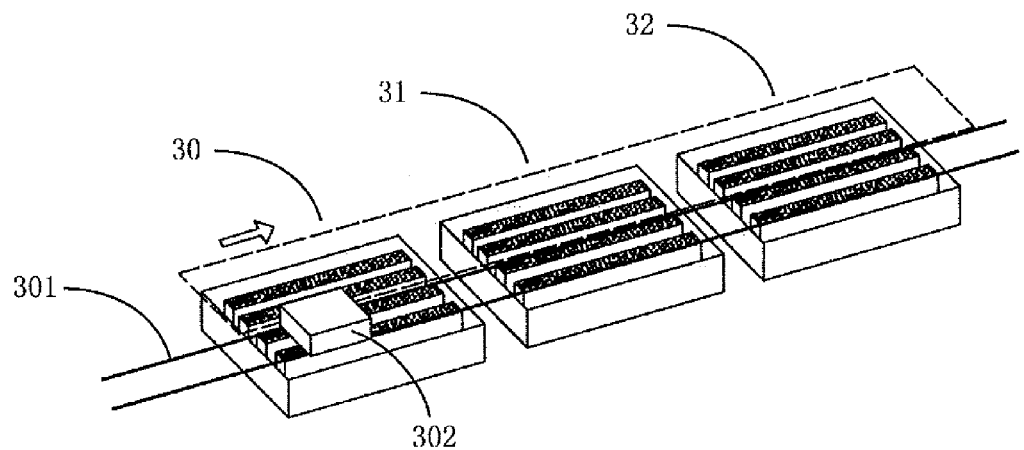
FIG. 4 illustrates a schematic diagram of the preheat section in an embodiment.

In a field application embodiment, a plurality of the preheat zone can join to a preheat section of the furnace, to make the sample 302 reach the best temperature. FIG. 4 illustrates a schematic diagram of the preheat section in this embodiment. Referring to FIG. 4, the preheat section comprises the preheat zones 30, 31, and 32, which is set along the direction parallel to the moving direction of the sample 302. So that the sample 302 passes through the preheat zones 30, 31, and 32 in sequence guided by the guider 301, to get the purpose of preheating.

The preheat zone in the embodiment comprises a plurality of the preheat module with the recycling structure for the hot air. The preheat zone can adjust the preheat modules opened or closed by the control module, according to the size of the samples. The preheat modules without the samples are closed, and the preheat modules with the samples are opened. So that, it can reduce the energy consumption of the preheat section by over 67%. In another words, the energy consumption of the preheat section decreases from 26~36 kW to 8~12 kW, which reduces the command to the electrical power, and satisfies the requirement of conserving electrical power and protecting the environment.

Two examples are introduced to show the benefit of the embodiments above.

The 1$^{st}$ Example

Figure 5A:
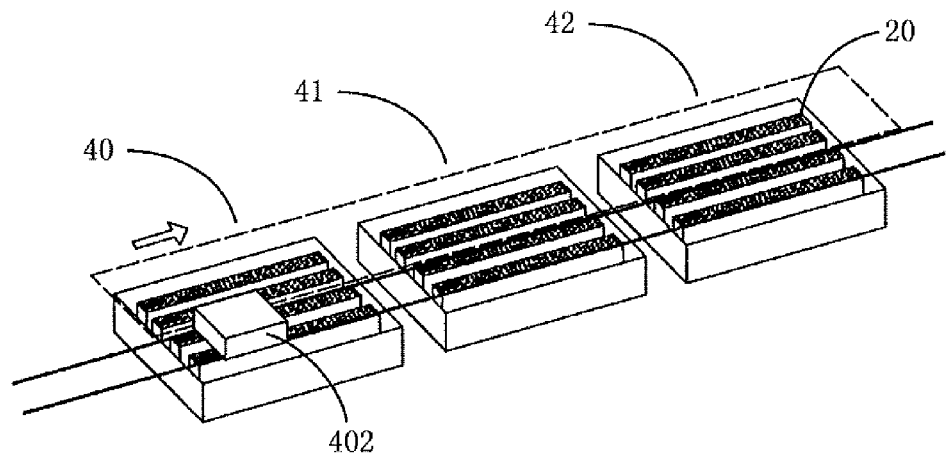
FIG. 5(a) illustrates a schematic diagram of the 1$^{st}$ example of the present invention.
Figure 5B:
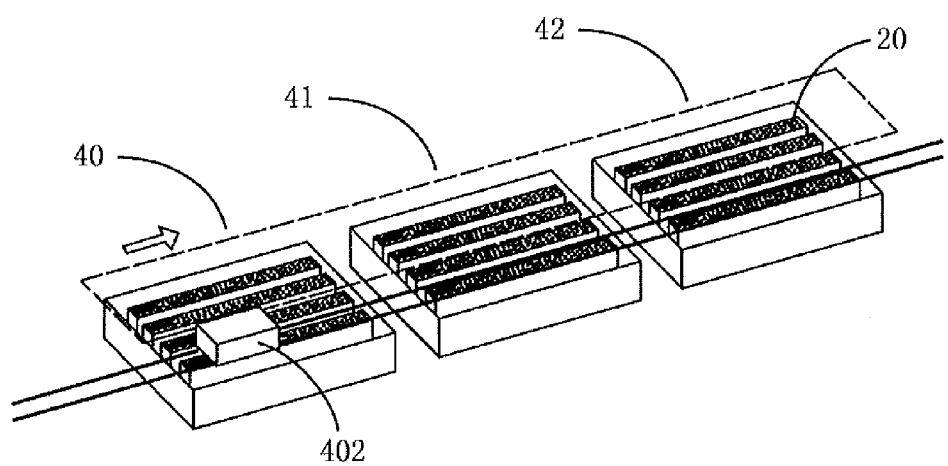
FIG. 5(b) illustrates a schematic diagram of the 2$^{nd}$ example of the present invention.

Referring to FIG. 5(a), the preheat section comprises preheat zones 41, 42, and 43 in this example, each of which has 700 mm in length and 600 mm in width. Each one comprises four preheat modules 20 parallel to each other along the axial direction. One tube with the power of 2 kW is set in each of the preheat module. The sample 402 is 200 mm in length and 150 mm in width. The control module can only open two preheat modules 20 to heat the sample 402, according to the structure of the preheating zones in this example. The other two preheat module 20 are closed. As the description above, when the preheat section is active, the heating power of each preheat zone is 4 kW, and the total heating power of the preheat section is 12 kW. Comparing to the structure illustrated in FIG. 1 in the prior art, the total power of the preheat section is 36 kW, so the preheat zone of the furnace is conserving energy by 66.7% in this example The 2$^{nd}$ Example Referring to FIG. 5(b), the preheat section comprises preheat zones 41, 42, and 43 in this example, each of which has 700 mm in length and 600 mm in width. Each one comprises four preheat modules 20 parallel to each other along the axial direction. One tube with the power of 2 kW is set in each of the preheat module. The sample 402 is 200 mm in length and 80 mm in width. The control module can only open one preheat modules 20 to heat the sample 402, according to the structure of the preheating zones in this example. The other two preheat module 20 are closed. As the description above, when the preheat section is active, the heating power of each preheat zone is 2 kW, and the total heating power of the preheat section is 6 kW. Comparing to the structure illustrated in FIG. 1 in the prior art, the total power of the preheat section is 36 kW, so the preheat zone of the furnace is conserving energy by 83.3% in this example.

The present invention has been disclosed as the preferred embodiments above, however, the above preferred embodiments are not described for limiting the present invention, various modifications, alterations and improvements can be made by persons skilled in this art without departing from the spirits and principles of the present invention, and therefore the protection scope of claims of the present invention is based on the range defined by the claims.

What is claimed is:

1. A preheat module, comprising:
   a heating chamber comprising a heating device and a first inlet, wherein the heating device is used for heating air in the heating chamber, and the first inlet is used for guiding the air into the heating chamber;
   a blower comprising a second inlet and a first outlet, wherein the second inlet is connected to the heating chamber for pumping the hot air, and the first outlet is used for the hot air flowing out of the blower; and
   a platform comprising a third inlet and a second outlet, wherein the third inlet is connected to the first outlet for guiding the hot air from the blower flowing to the platform, and the second outlet is used for the hot air from the third inlet flowing out of the preheat module to heat a sample;
   wherein the first inlet and the second outlet are set in a same plane, and the first inlet is used for the hot air from the second outlet entering into the heating chamber.

2. The preheat module of claim 1, wherein the platform, the heating chamber, and the blower are set in sequence along the direction perpendicular to the plane of the second outlet; two first inlets are set in the plane of the second outlet, and the longer sides of the two first inlets are parallel with the longer sides of the second outlet, the second outlet is between the two first inlets; and the second outlet has two sides which are not adjacent to the first inlet, and the third inlet is set in the plane perpendicular to the plane of the second outlet.

3. The preheat module of claim 1, wherein the second outlet of the platform further comprises a partition having a plurality of holes thereon, and the holes are used for guiding the hot air form the blower.

4. The preheat module of claim 1, wherein the heating device comprises one or more tubes set along an axial direction of the preheat module.

5. A preheat zone, comprising:
   a control module;
   a plurality of preheat modules of claim 1, wherein the plurality of preheat modules are set parallel in the axial direction; and
   wherein the control module is electrically connected to each preheat module of the plurality of preheat modules and configured to control each preheat module of the plurality of preheat modules to be open and closed independently.

6. The preheat zone of claim 5, wherein the second outlet of the platform further comprises a partition having a plurality of holes thereon and the holes are used for guiding the hot air from the blower.

7. The preheat zone of claim 5, wherein the heating device comprises one or more tubes set along an axial direction of the preheat module.

8. The preheat zone of claim 5, wherein the preheat zone further comprises a guider, which is set over a surface of the preheat zone with a distance, and the guider is set parallel to the axial direction of the preheat module, in order to transfer a sample set.

9. The preheat zone of claim 8, wherein the sample set is on a frame, which is moved by the guider.

10. A preheat section of a furnace, wherein the preheat section comprises one or more preheat zones of claim 5, each of the one or more preheat zones are in a same plane, and are set parallel along a moving direction of the sample set.

11. The preheat section of the furnace of claim 10, wherein the preheat section further comprises a guider, which is set over a surface of the one or more preheat zones with a distance, and the guider is set parallel to the axial direction of the preheat module, in order to transfer the sample set.

12. The preheat section of the furnace of claim 11, wherein the furnace is for wave soldering of tin, and the sample set is a printed circuit board.

\* \* \* \* \*